United States Patent
Lyumkis et al.

(10) Patent No.: US 10,678,972 B2
(45) Date of Patent: ***Jun. 9, 2020

(54) EXPONENTIALLY FITTED APPROXIMATION FOR ANISOTROPIC SEMICONDUCTOR EQUATIONS

(71) Applicant: Synopsys, Inc., Mountain View, CA (US)

(72) Inventors: Eugeny Lyumkis, Los Gatos, CA (US); Urs Von Matt, Campbell, CA (US); Vadim Koltyzhenkov, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 134 days.

This patent is subject to a terminal disclaimer.

(21) Appl. No.: 15/918,653

(22) Filed: Mar. 12, 2018

(65) Prior Publication Data

US 2018/0203962 A1    Jul. 19, 2018

Related U.S. Application Data

(63) Continuation of application No. 14/846,679, filed on Sep. 4, 2015, now Pat. No. 9,922,147.

(60) Provisional application No. 62/046,070, filed on Sep. 4, 2014.

(51) Int. Cl.
*G06F 30/23* (2020.01)
*G06F 30/367* (2020.01)

(52) U.S. Cl.
CPC .......... *G06F 30/23* (2020.01); *G06F 30/367* (2020.01)

(58) Field of Classification Search
CPC .. G06F 17/5018; G06F 17/5036; G06F 30/23; G06F 30/367
USPC .................... 703/2, 19, 5; 716/136; 345/419
See application file for complete search history.

(56) References Cited

U.S. PATENT DOCUMENTS

| | | | | |
|---|---|---|---|---|
| 6,987,511 | B2* | 1/2006 | Taubin | G06T 17/20 345/420 |
| 7,302,375 | B2* | 11/2007 | Kucherov | G06F 17/5036 702/7 |
| 7,707,525 | B2* | 4/2010 | Varon-Weinryb | G06F 17/5018 716/136 |

(Continued)

OTHER PUBLICATIONS

Eymard, et al., Finite volume methods. Handbook of numerical analysis, 7, pp. 713-1019 (2000).

(Continued)

*Primary Examiner* — Thai Q Phan
(74) *Attorney, Agent, or Firm* — Haynes Beffel & Wolfeld, LLP; Paul A. Durdik

(57) ABSTRACT

Roughly described, a method for determining characteristics of a body by simulation, useful in analyzing semiconductor devices, includes imposing a Delaunay mesh on a simulated body to be modeled, determining a system of node equations describing generation and flux of a set of at least a first physical quantity at each node in the mesh, and numerically solving the system of node equations to identify the physical quantities in the set at each node in the mesh, where the flux of the first physical quantity in the body, as represented in the node equations, is anisotropic. The method does not impose any limitation on the geometry of the device, on mesh elements, or on the orientation of the anisotropy.

16 Claims, 5 Drawing Sheets

(56) References Cited

U.S. PATENT DOCUMENTS

| | | | | |
|---|---|---|---|---|
| 7,987,074 B2* | 7/2011 | Carazzone | ............... | G01V 3/12 703/2 |
| 9,477,798 B1 | 10/2016 | Guoy et al. | | |
| 2006/0164415 A1* | 7/2006 | Smith | .................... | G06T 17/20 345/423 |
| 2008/0036760 A1* | 2/2008 | Smith | .................... | G06T 17/20 345/419 |
| 2008/0275672 A1* | 11/2008 | Varon-Weinryb | .......................... | G06F 17/5018 703/1 |
| 2009/0006053 A1* | 1/2009 | Carazzone | ............... | G01V 3/12 703/5 |
| 2015/0242545 A1* | 8/2015 | Cho | .................... | G06F 17/5009 703/2 |

OTHER PUBLICATIONS

Brezzi et al., "Discretization of Semiconductor Device Problems (I)," Numerical Methods in Electromagnetics, Handbook of Numerical Analysis, vol. XIII, pp. 317-441 (2005).

Scharfetter and Gummel. "Large-signal analysis of a silicon read diode oscillator" Electron Devices, IEEE Transactions on 16.1 (1969): 64-77.

Vassilevski, et al. "Application of Nonlinear Monotone Finite Volume Schemes to Advection-Diffusion Problems." Finite Volumes for Complex Applications VI Problems & Perspectives. Springer Berlin Heidelberg, 2011. 761-769.

Wang, "Solving Convection-Dominated Anisotropic Diffusion Equations by an Exponentially Fitted Finite Volum Method." Computers & Mathematics with Applications 44.8 (2002): 1249-1265.

Rose, et al., "Discretization of Anisotropic Convection-Diffusion Equations, Convective M-Matrices and Their Iterative Solution." VLSI Design-Langhorne-10.4 (2000): 49 pages.

U.S. Appl. No. 14/846,679—Notice of Allowance dated Oct. 5, 2017, 10 pages.

Silvaco, Inc., "A Box Method Discretisation for the Drift-Diffusion Equations in a Magnetic Field," Simulation Standard, vol. 20, No. 1, Jan.-Feb.-Mar. 2010, pp. 13-17.

U.S. Appl. No. 14/846,679—Corrected Notice of Allowance dated Dec. 21, 2017, 3 pages.

U.S. Appl. No. 14/846,679—Amendment Under 1.312 dated Dec. 12, 2017, 17 pages.

* cited by examiner

EXPONENTIALLY FITTED APPROXIMATION FOR ANISOTROPIC SEMICONDUCTOR EQUATIONS

CROSS-REFERENCE TO OTHER APPLICATION

This application is a continuation of U.S. application Ser. No. 14/846,679, filed Sep. 4, 2015, entitled "EXPONENTIALLY FITTED APPROXIMATION FOR ANISOTROPIC SEMICONDUCTOR EQUATIONS,", which claims the benefit U.S. Provisional Patent Application No. 62/046,070 filed on 4 Sep. 2014, which applications are incorporated herein by reference in their entirety.

BACKGROUND

1. Field of the Invention

The invention relates to numerical methods for determining properties of semiconductor devices by simulation, and more particularly to the use of such methods where the body to be modeled has anisotropic properties.

2. Description of Related Art

Numerical modeling and simulation has become an indispensable tool for the optimal design of semiconductor devices. As the dimensions of semiconductor devices continue to decrease, numerical simulation plays an increasingly important role in helping transistor designers develop strategies to overcome the design limits. Numerical modeling is used extensively also for simulating fabrication processes, such as the diffusion of dopants in a substrate. In digital and analog circuit design and analysis, numerical modeling of circuit simulations is used to assist in circuit verification. In device analysis, numerical modeling is used to determine parameters for compact models of such devices that can be used to analyze circuits that include such devices. For example, numerical modeling can be used to approximate such parameters as transistor I-V curves.

Such modeling is called Technology Computer-Aided Design (TCAD). The operation of a semiconductor device is described by a system of Partial Differential Equations (PDEs). The correct approximation (discretization) of PDEs, and, in particular, of semiconductor device equations (see [1]), is a basis of the numerical method. Modern devices might have anisotropy (i.e. the physical properties of materials are different for different directions). Among the reasons why devices have anisotropy can be the anisotropic properties of materials (such as Silicon Carbide) and/or the influence of mechanical stress which plays a very important role in the fabrication of modern devices. Anisotropy in a body to be modeled, at least for the types of anisotropy detailed herein, appear in the "transport coefficients" for the phenomenon being modeled. For example, in current continuity equations, the transport coefficient is an anisotropic mobility tensor. In the Poisson equation, the transport coefficient is an anisotropic dielectric permittivity tensor. In the heat equation, the transport coefficient is an anisotropic thermal conductivity tensor.

The main numerical method used in TCAD is the Finite Volume Method (see [2]) with Scharfetter-Gummel discretization (see [3]) of the semiconductor transport equations. The discretization is an approximation of the partial differential equations, and is often performed on Delaunay mesh (see, for example, [4]). The Scharfetter-Gummel approximation on Delaunay mesh has a few important properties; one of them guarantees that the numerically computed carrier density is always positive. Such a scheme is called monotone. However, the Scharfetter-Gummel approximation is monotone only for isotropic equations, and it may have non-physical negative solutions if directly applied to anisotropic equations.

There are limited cases when anisotropy can be easily taken into account in the Finite Volume method. In particular, if a simulation is performed using a tensor product mesh, and if the direction of anisotropy coincides with a mesh axis, then the discretization is simple; the situation is similar when the tensor product mesh is divided into triangles (tetrahedrons in 3D), but the direction of anisotropy still coincides with the edges of the right angle. However, these limitations are too serious: first, bodies having complicated geometry require a more general mesh which, for example, can be adjusted to non-rectilinear geometry; and second, in many practical applications, for example when the anisotropy is caused by stress engineering, the anisotropy is arbitrarily oriented and not known in advance.

This invention relates to the numerical discretization methods for simulating semiconductor devices, and in particular, to the construction of a new approximation for anisotropic semiconductor equations.

SUMMARY

Roughly described, the invention proposes a new nonlinear exponentially fitted approximation for anisotropic equations. The new approximation is a monotone scheme, and it has no dependency on the mesh orientation. This scheme can be applied equally to all the semiconductor equations, including Poisson equation, current continuity equation, and temperature equation. The new approximation is a modification of the Scharfetter-Gummel scheme and, as a result, it can be easily implemented into TCAD tools.

Thus a method for determining properties of a body by simulation, useful in analyzing semiconductor devices, includes imposing a Delaunay mesh on a simulated body to be modeled, determining a system of node equations describing generation and flux of a set of at least a first physical quantity at each node in the mesh, and numerically solving the system of node equations to identify the physical quantities in the set at each node in the mesh, where the transport coefficient of the first physical quantity in the body, as represented in the node equations, is anisotropic.

More particularly, a method for determining properties of a body by simulation includes imposing a Delaunay mesh on a simulated body to be modeled, determining a system of node equations describing net generation and flux of a set of at least a first physical quantity at each node in the mesh, and numerically solving the system of node equations to identify values for the physical quantities in the set at each node in the mesh. Suggested here is a method for simulation of semiconductor devices with anisotropic properties, when the anisotropy can be oriented in arbitrary directions, the geometry of simulated device can be general (not necessarily rectilinear), and the device is covered with an arbitrary triangular or tetrahedron mesh. At least one (and typically most or all) of the mesh elements have no edges which coincide with the direction of anisotropy.

In an embodiment, the node equation describing generation and flux of the first physical quantity at each node i can be written:

$$\sum_{v \in \aleph_i} \sum_{j \sim i} [k_{ij}^v \cdot J_{ij}^v + M(\Omega_i^v) \cdot r_i^v] = 0$$

where $v \in \aleph_i$ is an index of the elements in a set $\aleph_i$ of elements of the mesh which share node i;

for each v, j ranges through all nodes of the mesh which are vertices of element v;

$\Omega_i$ is a region that encloses node i;

$\Omega_i^v$, is an intersection of $\Omega_i$ and element v;

$r_i^v$ is an approximation of a net generation rate of the first physical quantity within the region $\Omega_i^v$;

$k_{ij}^v$ is the ratio of (1) the surface portion of $\Omega_i^v$ which corresponds to the edge (i,j), to (2) the length of the edge (i,j));

$M(\Omega_i^v)$ is a magnitude of the volume of region $\Omega_i^v$; and $J_{ij}^v$ is a discretization of flux density vector $\vec{J}$ of the first physical quantity along edge (i,j) of the mesh.

In an embodiment in which the first physical quantity is concentration of a particle, the node equations can include mass conservation equations which balance a flow density vector describing net outflow of the particle from a control region enclosing each node of the mesh, with net generation of the particle within the control region of each node.

In an embodiment in which the first physical quantity is concentration of a charged particle, wherein in the node equations can include current continuity equations which balance a current density vector describing net outflow of the particle from a control region enclosing each node of the mesh, with net generation of the particle within the control region of each node.

Preferably in such an embodiment, the current density vector as represented in the node equations can be written:

$$\vec{J} = \hat{\mu} \cdot (\nabla u + u \cdot \vec{E}),$$

where u is the current density in the body, where $\vec{E}$ is the electric field in the body, and where $\hat{\mu}$ is an anisotropic mobility tensor for the body.

Also preferably in such an embodiment, the node equation describing generation and flux of the first physical quantity at each node i can be written:

$$\Sigma_{v \in \aleph_i} \Sigma_{j \neq i} [k_{ij}^v \cdot J_{ij}^{Av} + M(\Omega_i^v) \cdot r_i^v] = 0$$

where $v \in \aleph_i$ is an index of the elements in a set $\aleph_i$ of elements of the mesh which share node i;

for each v, j ranges through all nodes of the mesh which are vertices of element v;

$\Omega_i^v$ is an intersection of a region $\Omega_i$ and element v, where $\Omega_i$ is a region that encloses node i;

$r_i^v$ is an approximation of the net generation rate of the first physical quantity within the region $\Omega_i^v$;

$k_{ij}^v$ is a finite volume coefficient associating node i with node j for purposes of the first physical quantity;

$M(\Omega_i^v)$ is a magnitude of the volume of region $\Omega_i^v$;

$$J_{ij}^{Av} = \mu_{ij}^v g_{ij}^{sv};$$

$\mu_{ij}^v$ is a carrier mobility between nodes i and j within element v;

$$g_{ij}^{sv} = \frac{1}{l}(B(-x_{ij}^{*v}) \cdot u_j - B(x_{ij}^{*v}) \cdot u_i);$$

l is the length of a vector $\vec{l} = \vec{v}_j - \vec{v}_i$, where $\vec{v}_i, \vec{v}_j$ are coordinates of nodes i and j, respectively;

B(x) is the Bernoulli function;

$u_i$ is the carrier density at node i, $u_j$ is the carrier density at node j, $$x_{ij}^{*v} = x_{ij}^v + x_{ij}^{sv};$$

$$x_{ij}^v = (\vec{E}_{0.5}, \vec{l}), \text{ where } \vec{E}_{0.5} = \frac{1}{l}\int_{v_i}^{v_j} \vec{E}(t)dt,$$

the integration of $\vec{E}(t)$ being performed along edge (i,j); and $x_{ij}^{sv}$ is a non-zero anisotropic correction.

Preferably the anisotropic correction is given by $$x_{ij}^{sv} = ((\vec{\Sigma} + \nabla \ln(u))_{0.5}, \hat{S} \cdot \vec{l}),$$

where $(\vec{E} + \nabla \ln(u))_{0.5}$ is a mean of the quantity $(\hat{E} + \nabla \ln(u))$ along the edge (i,j), where $\hat{S}$ can be written as $$\hat{S} = Q \begin{pmatrix} 0 & & \\ & 0 & \\ & & 1 \end{pmatrix} Q^T,$$

and where Q is a rotation matrix.

In another embodiment in which the first physical quantity is temperature, the node equations can include heat equations which balance a heat flux density vector describing net outflow of heat from a control region enclosing each node of the mesh, with net generation of heat within the control region of each node.

Preferably in such an embodiment, the heat flux vector $\vec{J}$ can be written:

$$\vec{J} = -\hat{\kappa} \cdot \nabla T,$$

where T is temperature, and where $\hat{\kappa}$ is an anisotropic tensor of thermal conductivity in the body.

In an embodiment in which the first physical quantity is electrostatic potential, the node equations can include Poisson equations which balance electric field displacement in a control region enclosing each node of the mesh, with electric charge density within the control region of each node.

Preferably in such an embodiment the flux vector $\vec{J}$ can be written:

$$\vec{J} = -\hat{\varepsilon} \cdot \nabla \varphi,$$

where $\varphi$ is electrostatic potential, and where $\hat{\varepsilon}$ is an anisotropic tensor of electrical permittivity in the body.

Each of the above inventive aspects can be implemented in a system in which a meshing module imposes a mesh as described above, and a solver module solves the system of node equations as described above.

The above summary of the invention is provided in order to offer a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
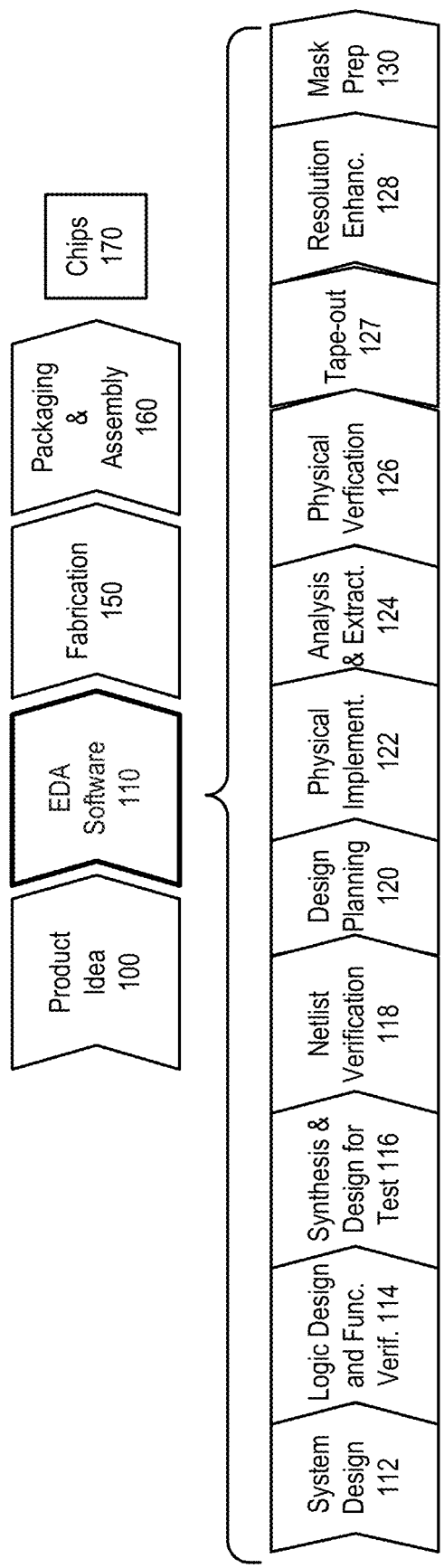
FIG. 1 shows a simplified representation of an illustrative integrated circuit design flow incorporating features of the technology.

FIG. 1 shows a simplified representation of an illustrative integrated circuit design flow incorporating features of the technology. At a high level, the process starts with the product idea (step 100) and is realized in an EDA (Electronic Design Automation) software design process (step 110). When the design is finalized, it can be taped-out (step 127). After tape out, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, System Studio, and DesignWare® products.

Logic design and functional verification (step 114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include the Astro and IC Compiler products.

Analysis and extraction (step 124): At this step, the circuit function is verified at a transistor level, this in turn permits what-if refinement. Example EDA software products from Synopsys, Inc. that can be used at this step include Astro-Rail, PrimeRail, Primetime, and Star RC/XT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape out" data for production of masks for lithographic use to produce finished chips. Example EDA software products from Synopsys, Inc. that can be used at this step include the CATS® family of products.

Resolution enhancement (step 128): This step involves geometric manipulations of the layout to improve manufacturability of the design. Example EDA software products from Synopsys, Inc. that can be used at this step include Proteus, ProteusAF, and PSMGen products.

Mask data preparation (step 130): This step provides the "tape-out" data for production of masks for lithographic use to produce finished chips. Example EDA software products from Synopsys, Inc. that can be used at this step include the CATS® family of products.

A typical integrated circuit manufacturing flow also includes a related flow, as follows:

(1) Develop individual process steps for manufacturing the integrated circuit. This can be modeled with the Synopsys tools "Sentaurus Process" and "Sentaurus Topography". The input information here includes process conditions like temperature, reactor ambient, implant energy, etc. The output information is the changes in geometry or doping profiles or stress distribution. Aspects of the invention can be used in this step of the manufacturing flow.

(2) Integrate the individual process steps into the complete process flow. This can be modeled with the Synopsys tool "Sentaurus Process". The input information here includes the collection of the process steps in the appropriate sequence. The output includes the geometry, the doping profiles, and the stress distribution for the transistors and the space in between the transistors. Aspects of the invention can be used also in this step of the manufacturing flow.

(3) Analyze performance of the transistor manufactured with this process flow. This can be done with the Synopsys tool "Sentaurus Device". The input information here includes the output of step (2) and the biases applied to transistor terminals. The output information includes the currents and capacitances of the transistors for each bias combination. Aspects of the invention can be used also in this step of the manufacturing flow.

The output information developed in step (3) characterizes the transistors made using the process, and the characteristics are then provided to circuit simulators such as HSPICE in order to permit a designer to analyze circuit designs at a transistor level. By analyzing the circuit at a transistor level, the designer is able to develop better designs.

If necessary, modify the process steps and the process flow to achieve the desired transistor performance. This can be done iteratively by using the Synopsys tools mentioned above.

Once the process flow is ready, it can be used for manufacturing multiple circuit designs coming from various designers in various companies. The EDA flow 112-130 will be used by such designers. The parallel flow described here can be used for example at a foundry to develop a process flow that can be used to manufacture designs coming from the designers. A combination of the process flow and the masks made from step 130 are used to manufacture any particular circuit. If the designers are at a different company, e.g. a fabless company, then usually it is the foundry that performs this parallel process flow whereas the process steps of FIG. 1 are performed typically by the fabless company. If the integrated circuit is manufactured at an IDM (integrated device manufacturer) company instead of the combination of a fabless company and a foundry, then both parallel flows described above are done at the same IDM company.

Figure 2:
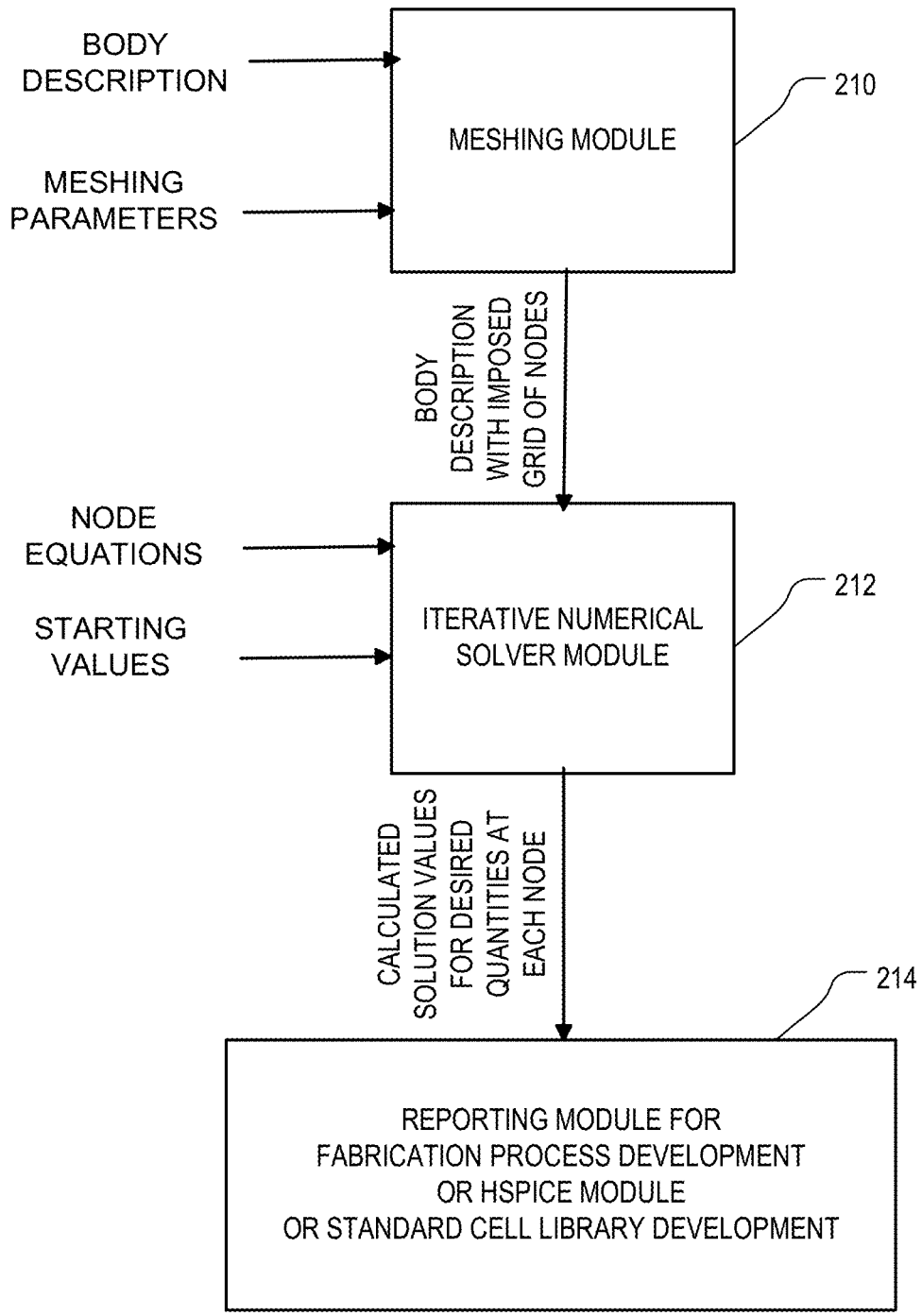
FIG. 2 illustrates the use of a system implementing aspects of the invention.

FIG. 2 illustrates the use of a system implementing aspects of the invention. The system includes a meshing module 210, which receives from a user a description of the body to be modeled, and any parameters to be used in imposing the mesh on the body. The body need not be an entire structure (such as an entire transistor). In fact it is often equally accurate and far more efficient to use only one quadrant or one octant of the overall structure, and establish reflective boundary conditions at the quadrant faces. Also, whereas in one embodiment the body is 3-dimensional, in another embodiment the body is 2-dimensional.

Figure 3:
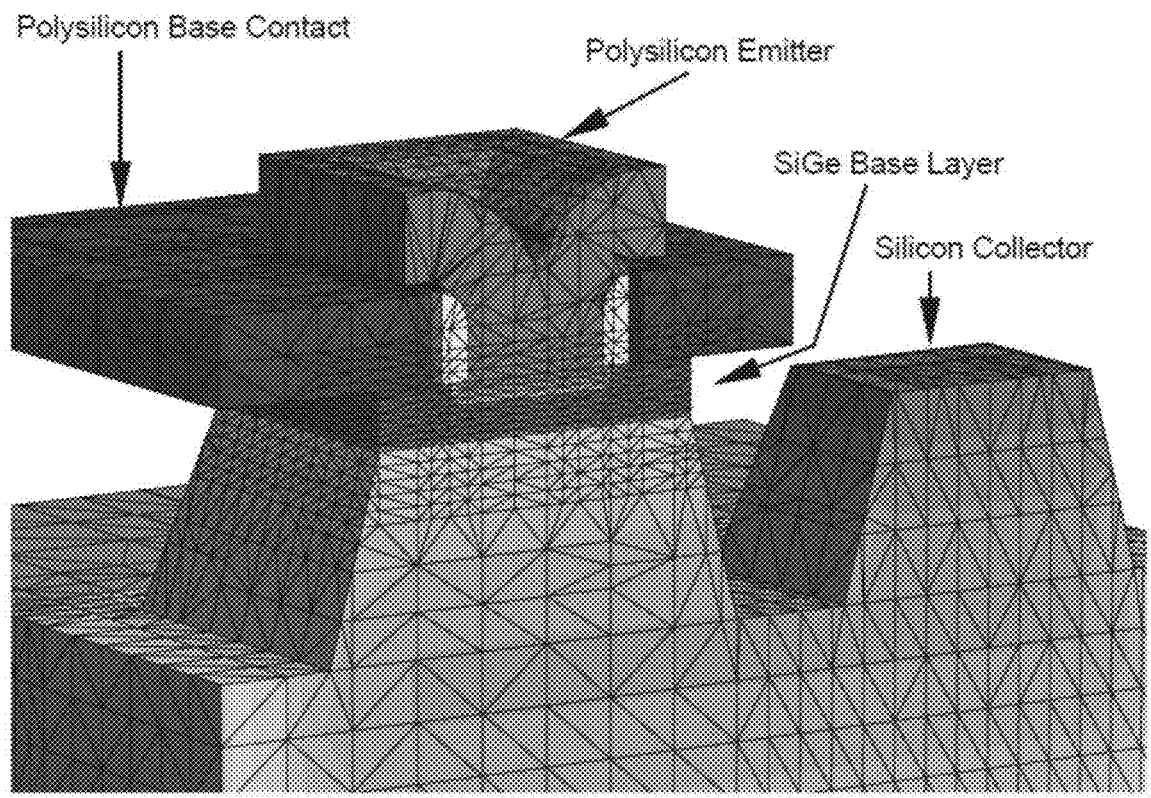
FIG. 3 illustrates an example body with a mesh imposed therein.

Module 210 creates ("imposes") a mesh of nodes in the body to be modeled, in the sense that each node is assigned a position in or around the body. The mesh can be 2- or 3-dimensional in various embodiments. FIG. 3 illustrates an example of a 3-dimensional SiGe HBT structure with a 3-dimensional mesh imposed therein. It can be seen that the mesh need not be uniform, and in some embodiments it is made more dense in regions that are close to a materials boundary. While in other embodiments the mesh elements can have other shapes, the mesh in FIG. 3 is tetrahedral. Preferably the mesh satisfies the Delaunay property that none of the nodes of the mesh are inside the circumsphere of any of the other tetrahedrons. For a 2-dimensional triangular mesh, the mesh preferably satisfies the Delaunay property that none of the nodes of the mesh are inside the circumcircle of any of the other triangles. The mesh edges define mesh elements (triangles or tetrahedra), at least one of which has no edges that coincide with the direction of anisotropy of the target physical quantity in the body. (Note that as used herein, a mesh "element" defined by mesh edges is the smallest region defined by the mesh edges. That is, it does not have any mesh edges inside.)

A node data structure is created for each node, which indicates the position of the mesh node in the body (in three dimensions), and values for various known properties of the body at that position. Each mesh node data structure also includes a field for the physical quantity or quantities for which the node equations are to be solved.

Meshing module 210 outputs a description of the body with the imposed mesh of nodes. The output is in a predefined format. In one embodiment the output is written to a non-transitory computer readable medium such as a disk drive or computer memory.

The output of meshing module 210 is provided to an iterative numerical solver module 212, which may include or be part of a Technology Computer Aided Design (TCAD) module, such as Sentaurus Device, available from Synopsys, Inc., Mountain View, Calif. The solver module 212 models the behavior of a material structure, by simulating the behavior on a computer system. A user also provides the node equations to solver module 212, and starting values for various quantities referenced in the node equations.

Solver module 212 provides as output an indication of the solution values calculated by the solver, for the quantity or quantities of interest, at each node of the mesh. Like the output of meshing module 210, the output of solver module 212 is provided in a predefined format. The output is reported to a user by a reporting module 214. In one embodiment the output is written to a non-transitory computer readable medium such as a disk drive or computer memory, and in a further embodiment the output can be provided to a visualization module which presents the distribution of quantities across the body in a visual form which simplifies user interpretation of the results. In still another embodiment, if a time-stepped or bias-stepped simulation is being performed, then the calculated solution values can be fed back to the solver module as new starting values for the next iteration of the simulation.

The results are then used, in various embodiments, for a variety of real world aspects of building or improving integrated circuit devices. In one embodiment, for example, the results are used to develop or improve a fabrication process flow that can be used to manufacture designs. A combination of the process flow and the masks made from step 130 are used to manufacture any particular circuit. In another embodiment the results are used to characterize or improve transistors and other devices. In other embodiments the results are used to develop HSPICE models of integrated circuit devices, in order to enable designers to develop better circuit designs and layouts. In yet other embodiments the results are used to improve process flow to achieve the desired transistor performance. Thus the numerical values obtained by the methods and systems described herein are used for real world technological development or implementation of semiconductor manufacturing processes or circuit designs.

The node equations provided to solver module 212, in various embodiments of the invention, use Scharfetter-Gummel discretized approximations of the partial differential equations describing the physical phenomenon to be modeled. However, the approximations are modified with a nonlinear argument x* as described below. The inclusion of this argument permits modeling of anisotropic semiconductor equations without losing conservation or monotonicity. The following sets forth a mathematical justification for the use of such node equations.

In general, stationary equations of semiconductor devices can be written in the form of a set of partial differential equations as follows:

$$-\nabla \vec{J} = R \qquad \text{(eq. 1)}$$

where $\vec{J}$ is the flux of a physical quantity flowing into the nodes and R is the net generation rate for the physical quantity at the nodes. Thus this equation balances net outflow of physical quantity from each node, with net generation of the physical quantity at that node. For example:

where the target physical quantity is concentration of a charged particle, which may for instance be a carrier such as an electron or a hole, then the partial differential equation may be a current continuity equation. In this case $\vec{J}$ is the current density vector, and R is the net generation rate of the particle. (Where the target physical quantity is concentration of more generally a particle, without specifying whether or not it is charged, then the partial differential equation may be a mass conservation equations. $\vec{J}$ is the particle flow density vector, and R is the net generation rate of the particle.)

where the target physical quantity is electrostatic potential, then the partial differential equation may be a Poisson equation. In this case $\vec{J}$ is the electric displacement field and R is the electric charge density.

where the target physical quantity is temperature, then the partial differential equation may be a heat equation. In this case $\vec{J}$ is the heat flux density vector, and R is the heat generation rate.

Note that as used herein, the "net generation rate" can be positive (indicating an increase in the physical quantity over time), or negative (indicating a decrease in the physical quantity over time). It can also be zero, for example if there is no mechanism for the physical quantity to change at all, other than by net inflow or outflow. Similarly, as used herein, a vector describing net flow "into" a region, or a vector describing net outflow "from" a region, both can be positive or negative.

Let $\Omega$ be the domain (a region of the 2- or 3-dimensional body being modeled) where equation (eq. 1) is supposed to be solved, and let us cover this domain by the Delaunay mesh. For each node (vertex) i of the mesh the discretization of (eq. 1) is performed within the volume $\Omega_i$, which is usually called as 'control volume'. The control volume is a 2- or 3-dimensional region which encloses node i, and in one embodiment it is a Voronoi volume. In the Finite Volume (FV) method for each vertex i the discretized equation (eq. 1) can be written as follows:

$$\Sigma_{j \neq i} k_{ij} \cdot J_{ij} + M(\Omega_i) \cdot r_i = 0 \qquad \text{(eq. 2)}$$

where
the summation is performed over all mesh edges (i,j) that include the node i;

$J_{ij}$ is the discretization of vector $\vec{J}$ along the edge (i,j);
$r_i$ is the approximation (usually just the value) of R at vertex 'i';
$k_{ij}$ is a finite volume geometrical coefficient (ratio of the surface portion of the control volume which corresponds to the edge (i,j), to the length of the edge (i,j));
$M(\Omega_i)$ is a magnitude of the region $\Omega_i$ (volume if $\Omega_i$ is 3-dimensional, or area if $\Omega_i$ is 2-dimensional).

The flux density $\vec{J}$ depends on solution variables, which are:
Carrier density u for the current continuity equations,
Electrostatic potential $\varphi$ for the Poisson equation,
Temperature T for the heat equation.

Note that in general, the method can calculate more than one type of quantity at each node. For example, if three physical quantities are to be targeted, which are interrelated with each other, then the system of node equations can include three equations for each node of the mesh: one describing outflow and net generation for each of the three physical quantities. For simplicity, the following description addresses only one of such physical quantities (sometimes called a "first one of a set of physical quantities"), it being understood that the set could also include additional physical quantities which may or may not have anisotropy.

Proper approximation of flux density $\vec{J}$ is important for the accuracy and stability of discretization of the equation (eq. 1). (As notation J is commonly used in the literature for current density, for heat and Poisson equations we denote the flux density with letter w).

We have to note here that properties of the various elements which share the edge (i,j), might be different. To take this into account, the assembling (eq. 2) is performed element-wise, i.e. equation (eq. 2) is modified. Let $\aleph_i$ be a set of elements around vertex i (i.e. the set of elements that share vertex i), and $v \in \aleph_i$ is an index of these elements. In the example of FIG. 3, each of these elements are tetrahedra, but in another embodiment they could have other shapes. If each quantity in (eq. 2) has the same meaning as above, but define in the element v only (we denote these quantities with superscript v), equation (eq. 2) for the node i can be rewritten in the form:

$$\Sigma_{v \in \aleph_i} \Sigma_{j \neq i} [k_{ij}^v \cdot J_{ij}^v + M(\Omega_i^v) \cdot r_i^v] = 0, \qquad \text{(eq. 2a)}$$

where
the inner summation is performed over all mesh edges (i,j) that include the node i and a node j which is a vertex of element v;

$J_{ij}^v$ is the discretization of vector $\vec{J}$ along the edge (i,j);
$\Omega_i^v$ is the intersection of $\Omega_i$ and element v;
$r_i^v$ is the approximation (usually just the value) of R within the region $\Omega_i^v$;
$k_{ij}^v$ is a finite volume geometrical coefficient (ratio of the surface portion of $\Omega_i^v$ which corresponds to the edge (i,j), to the length of the edge (i,j));
$M(\Omega_i^v)$ is a magnitude (volume or area, depending on whether the region is 3- or 2-dimensional, respectively) of the region $\Omega_i^v$.

The flux density $\vec{J}$ depends on solution variables, which are:
Carrier density u for the current continuity equations,
Electrostatic potential $\varphi$ for the Poisson equation,
Temperature T for the heat equation.

Although equation (eq. 2a) is more accurate, for simplicity below we will sometimes refer to just (eq. 2) as a nodal equation.

1. Isotropic Scharfetter-Gummel Scheme for Current Continuity Equation 1.1 Current Continuity Equation Before proceeding to the anisotropic case, some background on the conventional isotropic case will be useful.

The current density vector for the electron continuity equation can be written in the following form $$\vec{J} = \mu \cdot (\nabla u + u \cdot \vec{E}) = \mu \cdot \vec{g} \qquad \text{(eq. 3)}$$

where
$\vec{E}$ is the electric field vector,
$\mu$ is the mobility,
$\vec{g}$ is a vector $$\frac{\vec{J}}{\mu},$$

called here 'current density without mobility'.

The hole continuity equation is quite similar to (eq. 3) (with some different signs), and the reader will understand how to adapt (eq. 3) for use with holes.

1.2 Conservation, Monotonicity, FV Method

Conservation.

The equations (eq. 1) and (eq. 3) describe conservation of electric charge. An important property of a numerical approximation should be the fulfillment of the numerical analog of the conservation laws. The FV approximation (eq. 2a) is always conservative, so this property is fulfilled.

Monotonicity.

Based on the physical meaning, the carrier density u should always be positive. Thereby a second important property for a numerical approximation is the monotonicity: for a physically correct problem, a monotone scheme guarantees that the numerically computed carrier density is always positive. For the heat and Poisson equations a monotonic approximation is important as well as it guarantees the absence of non-physical oscillations of the solution.

A numerical discretization approximates PDE (eq. 1) as a system of algebraic equations:

$$\wedge \cdot \vec{u} = \vec{b} \quad \text{(eq. 4)}$$

where $\vec{b}$ is the right hand side vector;

$\vec{u}$ is the vector of unknown values of the function u;

$\wedge$ is the nonsingular matrix of system.

A sufficient condition for the monotonicity of the scheme (eq. 4) is the requirement for the matrix $\wedge$ being "M-matrix".

M-Matrix.

A matrix $A=(a_{mn})$ is said to be nonnegative, denoted by $A\geq 0$, if all of its entries $a_{mn}\geq 0$. Similarly, A matrix $A=(a_{mn})$ is said to be positive, denoted by $A\geq 0$, if all of its entries $(a_{mn}>0)$. Let Z denote the class of Z-matrices, which are square matrices with non-positive off-diagonal elements and positive diagonal. Mathematically, the class of matrices Z can be written:

$$Z \equiv \{A = (a_{mn}) | a_{mn} > 0, a_{mn} \leq 0, m \neq n\}. \quad \text{(eq. 5)}$$

Definition 1.

A Z-matrix A is called an M-matrix if it is nonsingular and $A^{-1} \geq 0$.

Definition 2.

A Z-matrix A is said to be weak column diagonal dominant if $\Sigma_m a_{mn} \geq 0$ for any n, and there is $n_0$ for which $\Sigma_m a_{mn_0} > 0$.

Proposition 1.

If Z-matrix A has weak column diagonal dominant, then A is M-matrix and $A^{-1}$ is positive, i.e. $a_{mn} > 0$.

From proposition (1) we have the following very important result.

Proposition 2.

If the matrix $\wedge$ of system (eq. 3) is a Z-matrix with weak column diagonal dominant and non-zero vector $\vec{b} \geq 0$, then the solution $\vec{u}$ will be positive.

FV Method

An important step of a finite volume method is the approximation of the projection of the vector $\vec{g}$ (current density without mobility) onto a mesh edge (i,j), where i and j indicate two adjacent vertices (nodes) of the mesh.

$$i \text{--------} > j$$

Let $\vec{v}_I, \vec{v}_J$ be the coordinates of the two vertices of the edge (i,j).

Then let $\vec{l} = \vec{v}_J - \vec{v}_I$; $l = \|\vec{l}\|$; and $\vec{\tau} = \vec{l}/l$.

The isotropic Scharfetter-Gummel approximation is the following:

$$(\vec{g}, \vec{\tau}) \approx g_{ij} = \frac{1}{l}(B(-x_{ij}) \cdot u_j - B(x_{ij}) \cdot u_i) \quad \text{(eq. 6)}$$

where $$B(x) = \frac{x}{e^x - 1} \text{ is the Bernoulli function;} \quad \text{(eq. 7)}$$

$$x_{ij} = \int_{v_i}^{v_j} (\vec{E}, \vec{\tau}) dt = (\vec{E}_{0.5}, \vec{l}), \vec{E}_{0.5} = \frac{1}{l} \int_{v_i}^{v_j} \vec{E}(t) dt,$$

where the integration of $\vec{E}(t)$ is performed along edge (i,j).

In the isotropic case the vector $\vec{E} = \alpha \cdot \nabla \beta$ and we have a two-point approximation along the edge:

$$x_{ij} \approx \frac{\alpha_i + \alpha_j}{2}(\beta_j - \beta_i). \quad \text{(eq. 8)}$$

Note that the discretized equation (eq. 6) is linear, i.e. the value $x_{ij}$ has no dependence on the solution variable u. The approximation vector $\vec{J}$ along the edge (i,j) (see eq. 2 or 2a) is the following:

$$J_{ij} = \mu_{ij} g_{ij}, \quad \text{(eq. 9)}$$

where $$\mu_{ij} = \frac{\mu_i + \mu_j}{2}$$

is approximation of mobility μ along edge (i,j).

Substituting the expression (eq. 9) of $J_{ij}$ into the equation (eq. 2), we will get the algebraic system (eq. 4), which we will write as follows:

$$\wedge(\mu_{ij}, x_{ij}) \cdot \vec{u} = \vec{b}, \quad \text{(eq. 10)}$$

where $x_{ij}$ is defined above in Eq. (eq. 8). For the isotropic case the matrix $\wedge$, like Eq. (eq. 8), does not depend on the solution variable u. Performing substitutions, it can be seen that, because B(x)>0 the following inequality are valid: $a_{mn} > 0$, $a_{mn} \leq 0$, m≠n. Thus $\wedge$ is Z-matrix.

Theorem 1.

For a Delaunay mesh (see [4]) the matrix (eq. 9) has weak column diagonal dominant, hence the FV method together with the Scharfetter-Gummel approximation is a monotone scheme for any values of the argument x (see [5]).

2. Anisotropic Exponentially Fitted Approximation

For the anisotropic case the equation for the current density has the following form:

$$\vec{J} = \hat{\mu} \cdot (\nabla u + u \cdot \vec{E})$$

where $\hat{\mu}$ is the mobility tensor. In the common case this tensor is equal to:

$$\hat{\mu} = Q \begin{pmatrix} \mu & & \\ & \mu & \\ & & \mu_a \end{pmatrix} Q^T,$$

where $\mu$ is the isotropic value, $\mu_a$ is the anisotropic value, and Q is a rotation matrix which transforms the mobility tensor $\hat{\mu}$ to the diagonal matrix. Note, that for simplicity we consider here that the matrix is anisotropic in one direction, and isotropic in two others. However the methodology described below can be easily generalized to two anisotropic directions as well.

The above tensor $\hat{\mu}$ can be written in the following form:

$$\hat{\mu} = \mu \cdot Q \left( \hat{I} + \begin{pmatrix} 0 & & \\ & 0 & \\ & & \delta \end{pmatrix} \right) Q^T = \mu \cdot (\hat{I} + \delta \hat{\delta}),$$

where $\delta = \dfrac{\mu_a - \mu}{\mu}, \hat{S} = Q \begin{pmatrix} 0 & & \\ & 0 & \\ & & 1 \end{pmatrix} Q^T,$ $\hat{I}$ is a unit tensor.

So, the current density vector can be written in the following form:

$$\vec{J} = \mu \cdot (\hat{I} + \delta \hat{S})(\nabla u + u \cdot \vec{E}) = \mu \cdot (\nabla u + u \cdot \vec{E^*}) = \mu \cdot \vec{g^s} \quad \text{(eq. 11)}$$

where $$\vec{g^s} = \nabla u + u \cdot \vec{E^*}, \vec{E^*} + \delta \hat{S} \cdot (\vec{E} + \nabla \ln(u)).$$

Despite that $\vec{E^*}$ here depends on the solution variable u, let us write the anisotropic exponentially fitted approximation similar to the traditional Scharfetter-Gummel scheme of (eq. 6), but with a new nonlinear argument $x^*$:

$$\left(\vec{g^s}, \vec{l}\right) \approx g_{ij}^s = \frac{1}{l}(B(-x_{ij}^*) \cdot u_j - B(x_{ij}^*) \cdot u_i) \quad \text{(eq. 12)}$$

where $x^*_{ij} = (\vec{E^*}_{0.5}, \vec{l}) = x_{ij} + x_{ij}^s;$ (eq. 13)

$x_{ij} = (\vec{E}_{0.5}, \vec{l})$ is the isotropic value; (eq. 14)

$x_{ij}^s = ((\vec{E} + \nabla \ln(u))_{0.5}, \hat{S} \cdot \vec{l})$ is an anisotropic correction. (eq. 15)

For the anisotropic case the value $x_{ij}$ has dependence on the solution variable u. Defining, like in Eq. (eq. 9), current density as $J_{ij}^A = \mu_{ij} g_{ij}^s$, and substituting it into equation (eq. 2), we'll get the node equation for anisotropic case:

$\Sigma_{j \neq i} k_{ij} \cdot J_{ij}^A + M(\Omega_i) \cdot r_i = 0$ (eq. 16a)

Using the element-wise assembling of (eq. 2a), the node equations becomes:

$\Sigma_{v \in \aleph_i} [k_{ij}^v \cdot J_{ij}^v + M(\Omega_i^v) \cdot r_i^v] = 0,$ (eq. 16b1)

where $J_{ij}^{Av} = \mu_{ij} g_{ij}^{sv},$ (eq. 16b2)

$g_{ij}^{sv} = \dfrac{1}{l}(B(-x_{ij}^{*v}) \cdot u_j - B(x_{ij}^{*v}) \cdot u_i),$ (eq. 16b3)

and the solution vector $\vec{u}$ is the target unknown for which the system of node equations are to be solved.
(Equations (eq. 16b1, 16b2 and 16b3) are sometimes referred to herein collectively as eq. 16b).

Equation (eq. 16a and 16b), similar to (eq. 4), can be presented as algebraic system of equations:

$\wedge(\mu_{ij}, x^*_{ij}) \cdot \vec{u} = \vec{b},$ (eq. 16c)

Note, that for the anisotropic case the operator $\wedge$ depends on the solution $\vec{u}$.

Like in the isotropic case, the discretized current density without mobility $\vec{g}_s$ approximates the continuity equation, which can be proven by applying a Taylor expansion when the mesh step l tends to 0. Also, like in the isotropic case, if the solution is obtained, then the coefficients $B(-x^*_{ij})$ and $B(x^*_{ij})$ will be positive, and the approximation will be monotone.

In summary, a main idea of an aspect of the invention is the use of a nonlinear argument $x^*$ in the Scharfetter-Gummel approximation of the current density. Thus for current density simulations, the node equations used for discretized current density may be those given by (eq. 2) or (eq. 2a), in combination with (eq. 12)-(eq. 15) above. In particular, the node equations may be those given by (eq. 16a) or (eq. 16b).

Note that the argument $x^*_{ij}$ now can be called a projection onto the edge (i,j) of the "generalized electric field" $\vec{E^*}$, and depends not just on the edge vertices i and j, as in the isotropic case, but on the values of all the vertices of the appropriate mesh element in the element-wise assembling (see 3.16b).

3. Heat Equation

For the anisotropic heat (or temperature) equation the heat flux density (with opposite sign) is equal to $\vec{w} = \hat{\kappa} \cdot \nabla T,$ (eq. 17)

where $\hat{\kappa}$ is the tensor of the thermal conductivity. In the common case this tensor is equal to:

$$\hat{\kappa} = Q \begin{pmatrix} \kappa & & \\ & \kappa & \\ & & \kappa_a \end{pmatrix} Q^T,$$

where $\kappa$ is the isotropic value, $\kappa_a$ is the anisotropic value, and Q is a rotation matrix. The tensor $\hat{\kappa}$ can be written in the following form:

$$\hat{\kappa} = \kappa \cdot Q \left( \hat{I} + \begin{pmatrix} 0 & & \\ & 0 & \\ & & \delta \end{pmatrix} \right) Q^T = \kappa \cdot (\hat{I} + \delta \hat{\delta}),$$

where $\delta = \dfrac{\kappa_a - \kappa}{\kappa}, \hat{S} = Q \begin{pmatrix} 0 & & \\ & 0 & \\ & & 1 \end{pmatrix} Q^T,$ $\hat{I}$ is a unit tensor.

So, the heat flow can be rewritten in the following form:

$$\vec{w} = \kappa\left(\nabla T + T \cdot \delta\hat{S}\frac{\nabla T}{T}\right) = \kappa \cdot (\nabla T + T \cdot \vec{E}), \quad \text{(eq. 18)}$$

where vector field $$\vec{E} = \delta\hat{S}\frac{\nabla T}{T}.$$

This heat flow is similar to the current density (eq. 3).

3.1 Nonlinear Scheme for Heat Equation

As the expression for the heat flux density for the temperature equation looks similar to the current density expression in the continuity equation, the exponential fitting for $w_{ij}$ in the temperature equation will have the following form:

$$(\vec{w}, \vec{\tau}) \approx w_{ij} = \frac{\kappa_{ij}}{l}(B(-x_{ij}) \cdot T_j - B(x_{ij}) \cdot T_i), \quad \text{(eq. 19)}$$

where $$x_{ij} = \int_{t_i}^{t_j}(\vec{E}, \vec{\tau})dt = \int_{t_i}^{t_j}\left(\delta\hat{S}\frac{\nabla T}{T}, \vec{\tau}\right)dt = \frac{\delta}{T^*}(\nabla T, \hat{S} \cdot \vec{l}), \quad \text{(eq. 20)}$$

$$\frac{1}{T^*} = \frac{1}{l}\int_{t_i}^{t_j}\frac{dt}{T} \approx \frac{1}{l}\int_0^l \frac{dt}{T_i + \frac{T_j - T_i}{l}t} = \frac{\ln(T_j) - \ln(T_i)}{T_j - T_i}. \quad \text{(eq. 21)}$$

The nonlinear scheme (eq. 19)-(eq. 21) also guarantees monotone approximation for the temperature equation.

Thus for simulations using the Heat equation, the node equations used for discretized flux of electric field, $w_{ij}$, may be those given by (eq. 2) or (eq. 2a), in combination with (eq. 19)-(eq. 21) above.

4. Poisson Equation
4.1 Nonlinear Anisotropic Scheme

For the Poisson equation the flux density is, actually, a vector of electric displacement field, which, with opposite sign, has the same form as (eq. 17);

$$\vec{w} = \hat{\varepsilon} \cdot \nabla\varphi, \quad \text{(eq. 22)}$$

where $\hat{\varepsilon}$ is the tensor of the electrical permittivity. Thus we can rewrite this flux in a form similar to (eq. 18):

$$\vec{w} = \varepsilon\left(\nabla\varphi + \varphi \cdot \delta\hat{S}\frac{\nabla\varphi}{\varphi}\right) = \varepsilon \cdot (\nabla\varphi + \varphi \cdot \vec{E}),$$

$$\text{where } \vec{E} = \delta\hat{S}\frac{\nabla\varphi}{\varphi}, \delta = \frac{\varepsilon_a - \varepsilon}{\varepsilon}.$$

The exponential fitting approximation is the following:

$$(\vec{w}, \vec{\tau}) \approx w_{ij} = \frac{\varepsilon_{ij}}{l}(B(-x_{ij}) \cdot \varphi_j - B(x_{ij}) \cdot \varphi_i), \quad \text{(eq. 23)}$$

where $$x_{ij} = \int_{\varphi_i}^{\varphi_j}(\vec{E}, \vec{\tau})dt = \int_{\varphi_i}^{\varphi_j}\left(\delta\hat{S}\frac{\nabla\varphi}{\varphi}, \vec{\tau}\right)dt = \frac{\delta}{\varphi^*}(\nabla\varphi, \hat{S} \cdot \vec{l}), \quad \text{(eq. 24)}$$

$$\frac{1}{\varphi^*} = \frac{1}{l}\int_{\varphi_i}^{\varphi_j}\frac{dt}{\varphi} \approx \frac{1}{l}\int_0^l \frac{dt}{\varphi_i + \frac{\varphi_j - \varphi_i}{l}t} = \frac{\ln(\varphi_j) - \ln(\varphi_i)}{\varphi_j - \varphi_i}. \quad \text{(eq. 25)}$$

Because the potential can change the sign depending on the applied boundary conditions and/or the right hand side of the equation (eq. 1), this scheme can become singular in such case, i.e. $\|\vec{E}\|=\infty$ when $\varphi=0$. To avoid this, we can replace the potential $\varphi$ in the equation (eq. 22) by $\varphi'=\varphi+\varphi_{ref}$, where $\varphi_{ref}$ is constant and considered as a new parameter of the approximation. Note that such a replacement does not change the equation (eq. 22), but a proper selection of $\varphi_{ref}$ (say, $\varphi_{ref}$ is large enough) will allow us to avoid the singularity problem.

$$\vec{w} = \varepsilon\left(\nabla\varphi + \varphi \cdot \delta\hat{S}\frac{\nabla\varphi}{\varphi}\right)\vec{w} = \varepsilon\left(\nabla\varphi' + \varphi' \cdot \delta\hat{S}\frac{\nabla\varphi'}{\varphi'}\right)$$

The approximation (eq. 23)-(eq. 25) can be rewritten in the form $$w_{ij} = \frac{\varepsilon_{ij}}{l}(B(-x_{ij}) \cdot \varphi_j - B(x_{ij}) \cdot \varphi_i + x_{ij} \cdot \varphi_{ref}) \quad \text{(eq. 26)}$$

where $$x_{ij} = \frac{\delta}{\varphi'^*}(\nabla\varphi, \hat{S} \cdot \vec{l}), \quad \text{(eq. 27)}$$

$$\frac{1}{\varphi'^*} = \frac{1}{l}\int_{\varphi_i}^{\varphi_j}\frac{dt}{\varphi'} \approx \frac{1}{l}\int_0^l \frac{dt}{\varphi'_i + \frac{\varphi'_j - \varphi'_i}{l}t} = \frac{\ln(\varphi'_j) - \ln(\varphi'_i)}{\varphi'_j - \varphi'_i}. \quad \text{(eq. 28)}$$

Now the approximation (eq. 26)-(eq. 28) is not singular any more.

Thus for simulations using the Poisson equation, the node equations used for discretized flux of electric field, $w_{ij}$, may be those given by (eq. 2) or (eq. 2a), in combination with (eq. 26)-(eq. 28) above.

Solver Module

Once the node equations and starting approximations are provided, a variety of known numerical solvers can be used to calculate the solution vector (the target physical quantity (ies) at all of the mesh nodes). Some of these solvers operate iteratively, whereas others do not. One well known iterative technique is Newton's Method. Newton's Method, as well as some advantageous modifications thereof, are described for example in U.S. Pat. No. 7,302,375, by inventors Kucherov and Moroz, incorporated by reference herein. Newton's Method iterates the following equation:

$$^{n+1}X = {}^nX - J^{-1}({}^nX)F({}^nX), n=0,1,\ldots, \quad \text{(eq. 29)}$$

with $^0X$ given by the starting approximations, and n iterates until some conversion criterion is met. In this equation, $^nX$ is the solution vector, F(X) is the vector of node equations provided to the solver module, and the m by m matrix J(X) is the Jacobian of F(X) (not to be confused with the flux continuity vector described above) and is given by $$J(X) = F'(X) = \begin{bmatrix} \frac{\partial F_1}{\partial x_1} & \cdots & \frac{\partial F_1}{\partial x_m} \\ \vdots & \ddots & \vdots \\ \frac{\partial F_m}{\partial x_1} & \cdots & \frac{\partial F_m}{\partial x_m} \end{bmatrix}. \quad \text{(eq. 30)}$$

The number of functions is m, which also equals the number of unknowns.

For example, Newton's Method may be used to solve a system of current continuity equations such as those given by (eq. 16b), where each i'th element of the function vector $F(X)$ is $\Sigma_{v \in \aleph} \Sigma_{j \neq i}[k_{ij}{}^v \cdot J_{ij}{}^{Av} + M(\Omega_i{}^v) \cdot r_i{}^v]$, where $J_{ij}{}^{Av} = \mu_{ij} g_{ij}{}^{sv}$ and $$g_{ij}^{sv} = \frac{1}{l}(B(-x_{ij}^{*v}) \cdot u_j - B(x_{ij}^{*v}) \cdot u_i).$$

The i'th element of the solution vector $^n X$ in this case is $u_i$. Note that depending on how the problem is set up, the solution vector may not contain the ultimately desired physical quantities; further calculations may be needed to convert the values in the solution vector to the target physical quantities.

Figure 4:
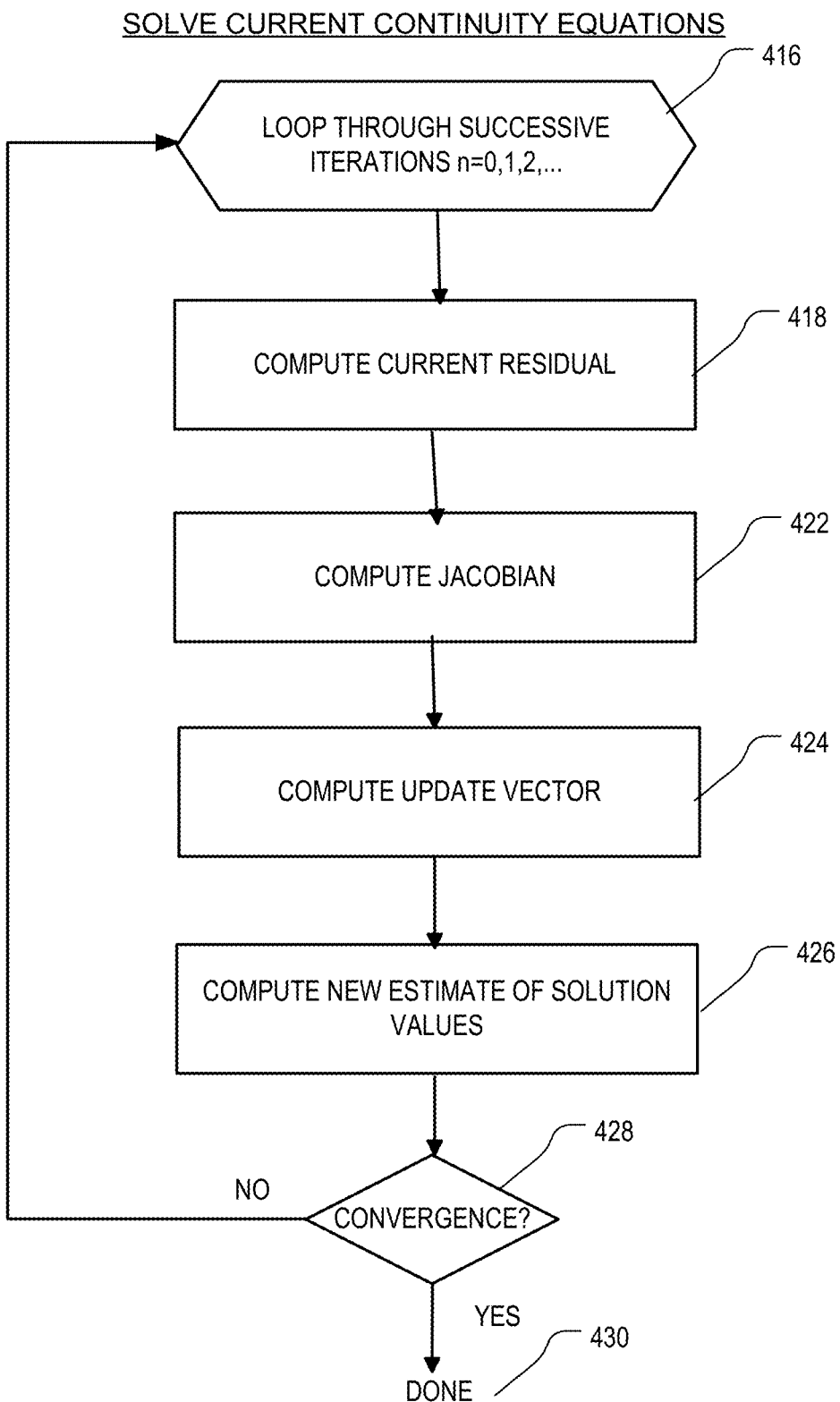
FIG. 4 is a high level flow chart illustrating use of Newton's Method in the solver module of FIG. 2.

FIG. 4 is a high level flow chart illustrating an application of Newton's Method to solve the system of current continuity equations in (eq. 16b). Prior to step 416, the simulation system already has an initial guess $^0 X$ for the solution vector. In step 416, the system begins a loop for successive iterations n. In step 418, for iteration n, the system computes the current residual, $F(^n X)$. In step 422, the system computes the Jacobian matrix $J(^n X)$. In step 424 the current update vector is computed, for example by inverting the Jacobian and multiplying the result by the negative of the current residual $F(^n X)$. Then in step 426, the system computes the new estimate $^{n+1} X$ of the solution vector, from $^{n+1} X = ^n X - J^{-1}(^n X) F(^n X)$.

In step 428, the simulation system determines whether convergence has been achieved. Various embodiments can employ various tests to determine convergence. In one embodiment, convergence is considered achieved when the norm of the differences between the solution values estimated in the current iteration and those estimated in the immediately prior iteration is less than a predetermined number. In another embodiment, convergence is considered achieved when the norm of the residual is less than a predetermined number. If it is determined that convergence has been achieved, then in step 430, the current value of $^n X$ is the solution vector. If not, then the system loops back to step 416 for the next Newton iteration.

Computer System

Figure 5:
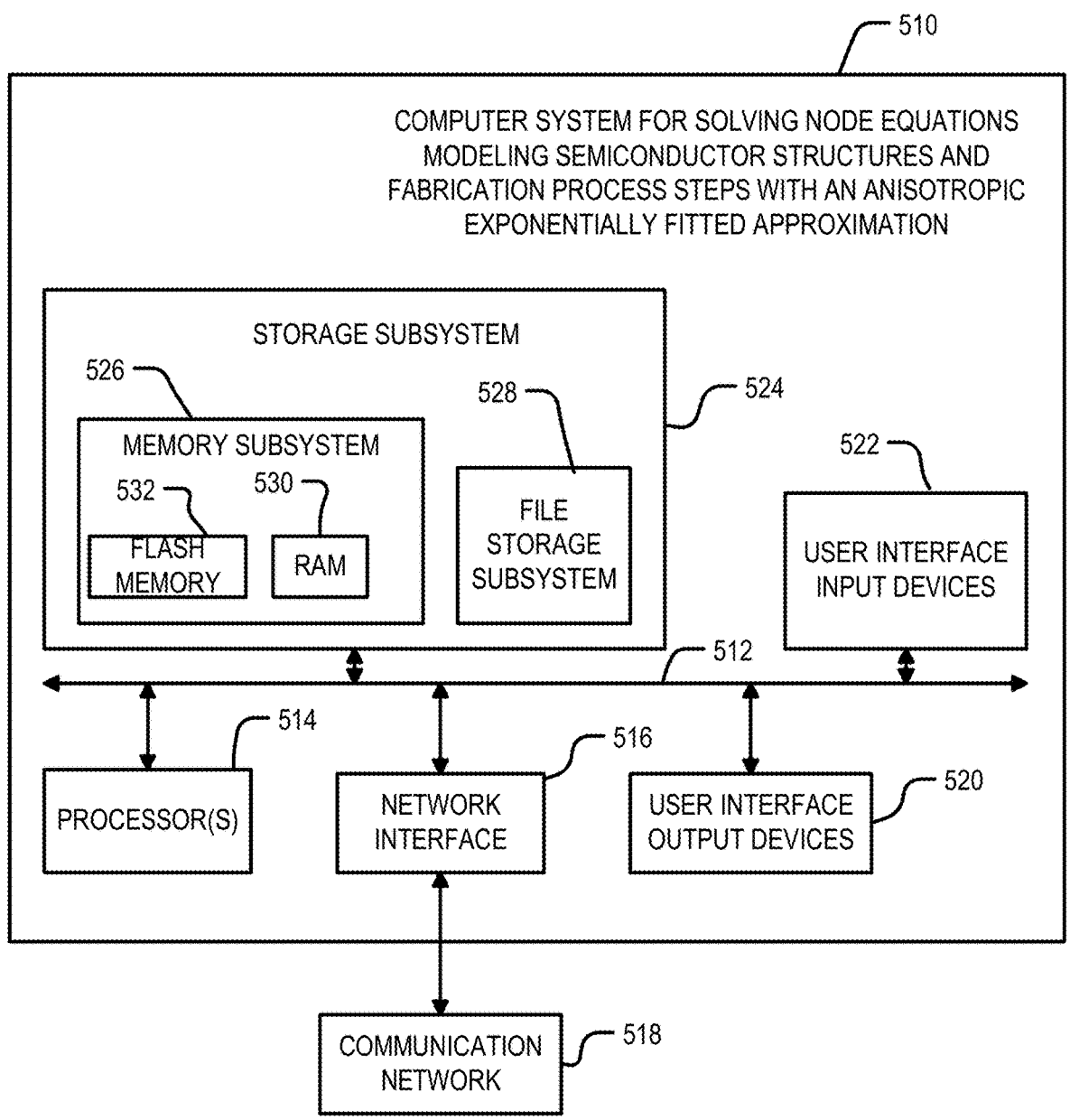
FIG. 5 is a simplified block diagram of a computer system 510 suitable for use with embodiments of the technology.

FIG. 5 is a simplified block diagram of a computer system 510 suitable for use with embodiments of the technology. For example, meshing module 210 and solver module 212 may be implemented using computer systems 510. Computer system 510 typically includes at least one processor 514 which communicates with a number of peripheral devices via bus subsystem 512. These peripheral devices may include a storage subsystem 524, comprising a memory subsystem 526 and a file storage subsystem 528, user interface input devices 522, user interface output devices 520, and a network interface subsystem 516. The input and output devices allow user interaction with computer system 510. Network interface subsystem 516 provides an interface to outside networks, including an interface to communication network 518, and is coupled via communication network 518 to corresponding interface devices in other computer systems. Communication network 518 may comprise many interconnected computer systems and communication links. These communication links may be wireline links, optical links, wireless links, or any other mechanisms for communication of information. While in one embodiment, communication network 518 is the Internet, communication network 518 may be any suitable computer network.

User interface input devices 522 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 510 or onto communication network 518.

User interface output devices 520 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image such as those of FIGS. 6, 7, 9A, and 9B. The display subsystem may also provide non-visual display such as via audio output devices. In general, use of the term "output device" is intended to include all possible types of devices and ways to output information from computer system 510 to the user or to another machine or computer system. Visualizations of quantities determined by the techniques herein may be presented on some of these output devices.

Storage subsystem 524 stores the basic programming and data constructs that provide the functionality of some or all of the embodiments described herein, including the methods described above. These software modules are generally executed by processor 514, to implement the logic of the methods described herein.

Memory subsystem 526 typically includes a number of memories including a main random access memory (RAM) 530 for storage of instructions and data during program execution and a read only memory (ROM) 532 in which fixed instructions are stored. File storage subsystem 528 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 528.

Bus subsystem 512 provides a mechanism for letting the various components and subsystems of computer system 510 communicate with each other as intended. Although bus subsystem 512 is shown schematically as a single bus, alternative embodiments of the bus subsystem may use multiple busses.

Computer system 510 itself can be of varying types including a personal computer, a portable computer, a workstation, a computer terminal, a network computer, a television, a mainframe, or any other data processing system or user device. Due to the ever-changing nature of computers and networks, the description of computer system 510 depicted in FIG. 5 is intended only as a specific example for purposes of illustrating the preferred embodiments. Many other configurations of computer system 510 are possible having more or less components than the computer system depicted in FIG. 5.

It will be appreciated that while the formulas set forth herein describe physical phenomena, such formulas could be written in many different forms and still describe the same physical phenomena. Thus in a particular embodiment of the invention for which the formulas are written in a different form, those formulas can still be re-written in the form described herein, because they still describe the same physical phenomena. As used herein, a particular formula "can be written" in a form set forth herein if and only if the particular formula is mathematically equivalent to the formula in the form set forth herein.

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly. [edit to mention only those of "signal, event or value" that are relevant in the particular case.]

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

REFERENCES

The following references are incorporated by reference herein.

[1] F. Brezzi, L. D. Marini, S. Micheletti, P. Pietra, R. Sacco, S. Wang. Discretization of Semiconductor Device Problems. In P. G. Ciarlet, W. H. A. Schilders, and E. J. W. ter Maten, editors, Special Volume: Numerical Methods, in Electromagnetics, Handbook of Numerical Analysis, XIII, pages 317-442. North-Holland, Amsterdam, 2005.

[2] R. Eymard, T. Gallou et, and R. Herbin. Finite volume methods. In P. G. Ciarlet and J.-L. Lions, editors, Techniques of Scientific Computing, Part III, Handbook of Numerical Analysis, VII, pages 713-1020. North-Holland, Amsterdam, 2000.

[3] Scharfetter, D., Gummel, H. Large-signal analysis of a silicon read diode oscillator. IEEE Trans. Electron Devices ED-16, pages 64-77. 1969

[4] F. P. Preparata and M. I. Shamos. Computational Geometry. Springer-Verlag, 1985.

[5] D. J. Rose, H. Shao, and C. S. Henriquez. Discretization of anisotropic convection-diffusion equations, convective M-matrix and their iterative solution. VLSI DESIGN, Vol. 10, No. 4, 485-529, 2000.

In addition, the following are also incorporated by reference herein for additional detail and variations they teach which can be applied to the embodiments described above:

U.S. Pat. No. 7,302,375, by inventors Kucherov et. al.

U.S. patent application Ser. No. 13/507,310, filed 20 Jun. 2012, by inventors Guoy et. al, U.S. patent application Ser. No. 14/479,070, filed 5 Sep. 2014, by inventors Moroz, et. al.

What is claimed is:

1. A system for determining properties of a body by simulation, useful in analyzing semiconductor devices, comprising:
   a processor executing instructions for imposing a Delaunay mesh on a simulated body to be modeled, the mesh having a plurality of nodes and further having edges connecting adjacent pairs of the nodes;
   a processor executing instructions for determining a system of node equations describing net generation and flux of a set of at least a first physical quantity at each node in the mesh; and
   a processor executing instructions for numerically solving the system of node equations to identify values for the physical quantities in the set at each node in the mesh,
   wherein the transport coefficient of the first physical quantity in the body, as represented in the node equations, is anisotropic in a particular direction,
   and wherein the mesh edges define a plurality of mesh elements, at least one of which has no edges that coincide with the particular direction.

2. The system of claim 1, wherein the transport coefficient of the first physical quantity in the body, as represented in the node equations, is anisotropic also in a second direction of the body,
   and wherein at least one of the mesh elements has no edges that coincide with the second direction.

3. The system of claim 1, wherein in the system of node equations, the node equation describing generation and flux of the first physical quantity at each node i can be written:

$$\sum_{j \neq i} k_{ij} \cdot J_{ij} + M(\Omega_i) \cdot r_i = 0$$

where
- j ranges through all nodes which are immediately adjacent to node i in the mesh;
- $r_i$ is an approximation of a net generation rate of the first physical quantity within a region $\Omega_i$ enclosing the node i;
- $k_{ij}$ is the ratio of (1) the surface portion of $\Omega_i$ which corresponds to the edge (i,j), to (2) the length of the edge (i,j));
- $M(\Omega_i)$ is a magnitude of the region $\Omega_i$; and
- $J_{ij}$ is a discretization of vector $\vec{J}$ along edge (i,j) of the mesh.

4. The system of claim 1, wherein in the system of node equations, the node equation describing generation and flux of the first physical quantity at each node i is:

$$\Sigma_{\nu \in \aleph_i} \Sigma_{j \neq i}[k_{ij}^{\nu} \cdot J_{ij}^{\nu} + M(\Omega_i^{\nu}) \cdot r_i^{\nu}] = 0$$

where
- $\nu \in \aleph_i$ is an index of the elements in a set $\aleph_i$ of elements of the mesh which share node i;
- for each $\nu$, j ranges through all nodes of the mesh which are vertices of element $\nu$;
- $\Omega_i$ is a region that encloses node i;
- $\Omega_i^{\nu}$ is an intersection of $\Omega_i$ and element $\nu$;
- $r_i^{\nu}$ is an approximation of a net generation rate of the first physical quantity within the region $\Omega_i^{\nu}$;
- $k_{ij}^{\nu}$ is the ratio of (1) the surface portion of $\Omega_i^{\nu}$ which corresponds to the edge (i,j), to (2) the length of the edge (i,j));
- $M(\Omega_i^{\nu})$ is a magnitude of the volume of region $\Omega_i^{\nu}$; and
- $J_{ij}^{\nu}$ is a discretization of flux density vector $\vec{J}$ of the first physical quantity along edge (i,j) of the mesh.

5. The system of claim 1, wherein in the node equations, net generation of the first physical quantity at each node in the mesh is zero.

6. The system of claim 1, wherein the simulated body to be modeled is 3-dimensional.

7. The system of claim 1, wherein the mesh is 3-dimensional.

8. The system of claim 1, wherein the first physical quantity is concentration of a particle,
wherein the node equations comprise mass conservation equations which balance a flow density vector describing net outflow of the particle from a control region enclosing each node of the mesh, with net generation of the particle within the control region of each node.

9. The system of claim 1, wherein the first physical quantity is concentration of a charged particle,
wherein the node equations comprise current continuity equations which balance a current density vector describing net outflow of the particle from a control region enclosing each node of the mesh, with net generation of the particle within the control region of each node.

10. The system of claim 9, wherein the current density vector as represented in the node equations can be written:

$$\vec{J} = \hat{\mu} \cdot (\nabla u + u \cdot \vec{E}),$$

where u is the current density in the body,
where $\vec{E}$ is the electric field in the body, and
where $\hat{\mu}$ is an anisotropic mobility tensor for the body.

11. The system of claim 10, wherein in the system of node equations, the node equation describing generation and flux of the first physical quantity at each node i can be written:

$$\Sigma_{\nu \in \aleph_i} \Sigma_{j \neq i}[k_{ij}^{\nu} \cdot J_{ij}^{A\nu} + M(\Omega_i^{\nu}) \cdot r_i^{\nu}] = 0,$$

where
- $\nu \in \aleph_i$ is an index of the elements in a set $\aleph_i$ of elements of the mesh which share node i;
- for each $\nu$, j ranges through all nodes of the mesh which are vertices of element $\nu$;
- $\Omega_i^{\nu}$ is an intersection of a region $\Omega_i$ and element $\nu$, where $\Omega_i$ is a region that encloses node i;
- $r_i^{\nu}$ is an approximation of the net generation rate of the first physical quantity within the region $\Omega_i^{\nu}$;
- $k_{ij}^{\nu}$ is a finite volume coefficient associating node i with node j for purposes of the first physical quantity;
- $M(\Omega_i^{\nu})$ is a magnitude of the volume of region $\Omega_i^{\nu}$;

$$J_{ij}^{A\nu} = \mu_{ij}^{\nu} g_{ij}^{s\nu};$$

$\mu_{ij}^{\nu}$ is a carrier mobility between nodes i and j within element $\nu$;

$$g_{ij}^{s\nu} = \frac{1}{l}(B(-x_{ij}^{*\nu}) \cdot u_j - B(x_{ij}^{*\nu}) \cdot u_i);$$

l is the length of a vector $\vec{l} = \vec{v_j} - \vec{v_i}$, where $\vec{v_i}, \vec{v_j}$ are coordinates of nodes i and j, respectively;
B(x) is the Bernoulli function;
$u_i$ is the carrier density at node i,
$u_j$ is the carrier density at node j, $$x_{ij}^{*\nu} = x_{ij}^{\nu} + x_{ij}^{s\nu};$$

$$x_{ij}^{\nu} = (\vec{E}_{0.5}, \vec{l}), \text{ where } \vec{E}_{0.5} = \frac{1}{l}\int_{v_i}^{v_j} \vec{E}(t)dt,$$

the integration of $\vec{E}(t)$ being performed along edge (i,j); and
$x_{ij}^{s\nu}$ is a non-zero anisotropic correction.

12. The method of claim 11, wherein the anisotropic correction is given by $$x_{ij}^{s\nu} = ((\vec{E} + \nabla \ln(u))_{0.5}, \hat{S} \cdot \hat{l}),$$

where $(\vec{E} + \nabla \ln(u))_{0.5}$ is a mean of the quantity $(\vec{E} + \nabla \ln(u))$ along the edge (i,j),
where $\hat{S}$ can be written as $$\hat{S} = Q \begin{pmatrix} 0 & & \\ & 0 & \\ & & 1 \end{pmatrix} Q^T,$$

and where Q is a rotation matrix.

13. The system of claim 1, wherein the first physical quantity is temperature,
wherein the node equations comprise heat equations which balance a heat flux density vector describing net outflow of heat from a control region enclosing each node of the mesh, with net generation of heat within the control region of each node.

14. The system of claim 13, wherein the heat flux vector $\vec{J}$ can be written:

$$\vec{J} = -\hat{\kappa} \cdot \nabla T,$$

where T is temperature,
and where $\hat{\kappa}$ is an anisotropic tensor of thermal conductivity in the body.

15. The system of claim 1, wherein the first physical quantity is electrostatic potential,
wherein the node equations comprise Poisson equations which balance electric field displacement in a control region enclosing each node of the mesh, with electric charge density within the control region of each node.

16. The system of claim 15, wherein the flux vector $\vec{J}$ can be written:

$$\vec{J} = -\hat{\varepsilon} \cdot \nabla \varphi,$$

where $\varphi$ is electrostatic potential,
and where $\hat{\varepsilon}$ is an anisotropic tensor of electrical permittivity in the body.

\* \* \* \* \*